United States Patent [19]

Tonari

[11] 3,767,112

[45] Oct. 23, 1973

[54] FREQUENCY PRESETTING EQUIPMENT

[75] Inventor: Hirohiko Tonari, Kyoto, Japan

[73] Assignee: Matsushita Electric Industrial Co., Ltd., Osaka, Japan

[22] Filed: Aug. 27, 1971

[21] Appl. No.: 175,519

[30] Foreign Application Priority Data

Aug. 28, 1970 Japan .............................. 45/75855

[52] U.S. Cl. ........................ 334/1, 325/459, 334/15, 334/47, 338/142

[51] Int. Cl. ............................................. H03j 5/06

[58] Field of Search ........................ 334/1, 7, 15, 47; 325/458, 459, 464, 465, 315, 317

[56] References Cited

UNITED STATES PATENTS

| | | | |
|---|---|---|---|
| 3,601,703 | 8/1971 | Midgley | 325/464 |
| 3,505,620 | 4/1970 | Miner | 334/15 |
| 3,629,708 | 12/1971 | Thurnell | 325/459 X |

*Primary Examiner*—Paul L. Gensler
*Attorney*—E. F. Wenderoth et al.

[57] ABSTRACT

Frequency presetting equipment adapted for a tuner device including $n(n>l)$ tuning circuits each having plural tuning diodes. The apparatus comprises $m(m>n)$ potentiometers in parallel connection one end of which is to be connected to a first power source, a first rotary switch having $m$ stationary contacts connected to $m$ movable terminals of said $m$ potentiometers and having a rotary terminal connected to said plural tuning diodes. Also included are band selection means consisting of at least one parallel connection of $m$ switches each of which has $n$ contact segments coupled to said $n$ tuning circuits and one common terminal. At least one additional rotary switch having $m$ stationary contacts is connected to said $m$ common terminals of said $m$ switches and has a rotary terminal and a single rotary knob is provided for rotating said first rotary switch and said at least one additional rotary switch at the same time whereby said $m$ switches respond to said $m$ potentiometers, respectively.

7 Claims, 10 Drawing Figures

INVENTOR
HIROHIKO TONARI

BY Wenderoth, Lind & Ponack
ATTORNEYS

INVENTOR
HIROHIKO TONARI

BY Wenderoth, Lind & Ponack
ATTORNEYS

INVENTOR
HIROHIKO TONARI

BY Wenderoth, Lind & Ponack
ATTORNEYS

PATENTED OCT 23 1973 3,767,112

SHEET 4 OF 4

INVENTOR
HIROHIKO TONARI

BY Wenderoth, Lind & Ponack
ATTORNEYS

FREQUENCY PRESETTING EQUIPMENT

FIELD OF THE INVENTION

The present invention relates to a tuning device for tuning a receiver to certain frequencies, and more particularly to a frequency presetting device including tuning diodes such as a voltage variable capacitor diode.

BACKGROUND OF THE INVENTION

In the past, VHF-UHF presettable television tuning devices including voltage variable capacitor diodes have had plural potentiometers, resistance adjusting knobs for adjusting each potentiometer, selecting knobs for selectively switching said potentiometers to said diodes, and plural band knobs for selecting a frequency band from plural bands.

Each of said band knobs has a cam which rotates to the VHF low band, VHF high band and UHF band. When a selecting knob is pushed, the band knob corresponding to the selecting knob is also driven so as to rotate a common lever. Said common lever has three rotating positions in accordance with three positions of the band knob, and closes or opens several electric contacts so that the VHF tuning circuit is switched to the UHF tuning circuit, or the VHF low band tuning circuit is switched to the VHF high band tuning circuit.

Said television tuning device has a number of disadvantages. When an operator wants to select one frequency out of plural present frequencies memorized by said resistance adjusting knobs, he has to move his hand over plural selecting knobs and pushes one of these knobs. The depression of a selecting knob causes a band knob i.e., a band memory mechanism to drive so that the predetermined rotative position of the band knob is apt to be changed and in addition a large pushing force is necessary. Further, the rotation of said common lever by said band knob creates a mechanical noise. Said band knobs have the common lever rotated at different angles from each other so that said selecting knobs must he rotated by different pushing forces. These different pushing forces of the knobs can confuse operators.

In addition, these prior art television tuning devices have many electric contacts, some of which are formed on an insulating base, but others driven by said common lever cannot be formed on the same insulating base. Therefore, assembling of the tuning device is not only troublesome, but is also inconvenient to connect with a television circuit.

OBJECTS OF THE INVENTION

An object of the present invention is to provide an electric circuit adapted for a tuning device comprising printed circuits associated with printed resistors.

Another object of the present invention is to provide a frequency presetting device comprising printed circuits associated with printed resistors.

A further object of the present invention is to provide a frequency presetting device which comprises printed circuits associated with printed resistors and which can be operated by a single rotary knob after being preset to desired frequency bands.

BRIEF DESCRIPTION OF THE SEVERAL FIGURES

These and other objects of the invention will become apparent from the following description, taken together with the accompanying drawings, in which.

Figure 6A:
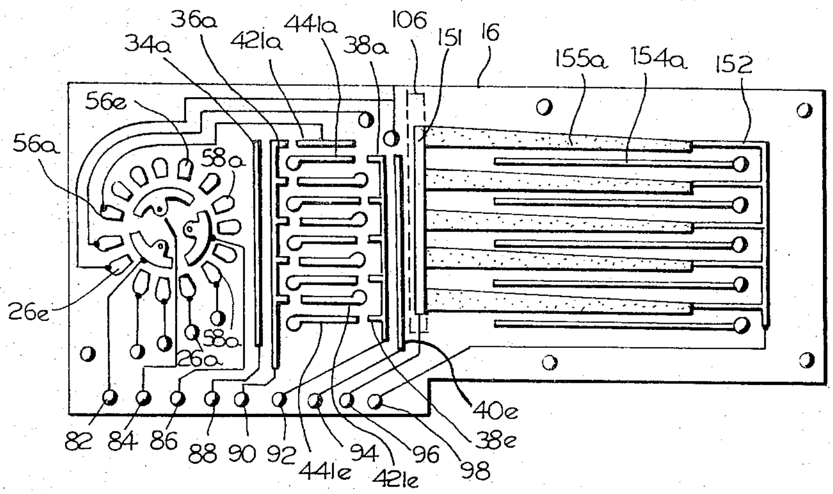

FIG. 6*a* is a front view of an insulating base 16 having conductors, resistors and electric contacts printed thereon.

Figure 6B:
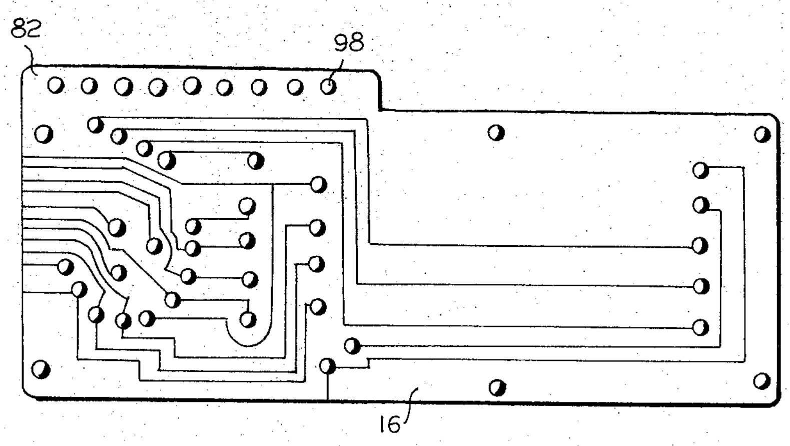

FIG. 6*b* is a back view of an insulating base 16 having conductors printed thereon.

Figure 1:
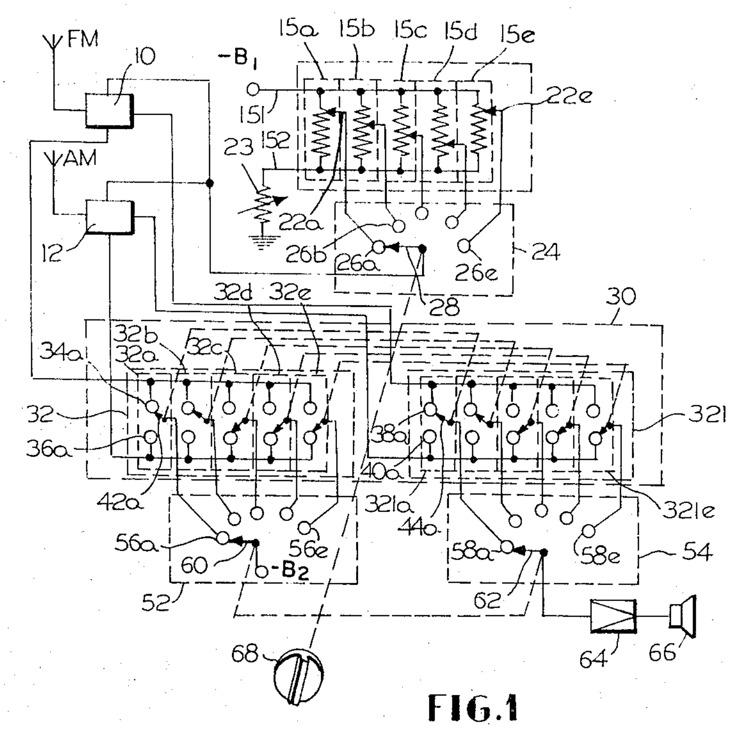
FIG. 1 is a circuit diagram, partly in block form and partly in schematic form, of an FM-AM radio receiver according to the present invention.
Figure 7:
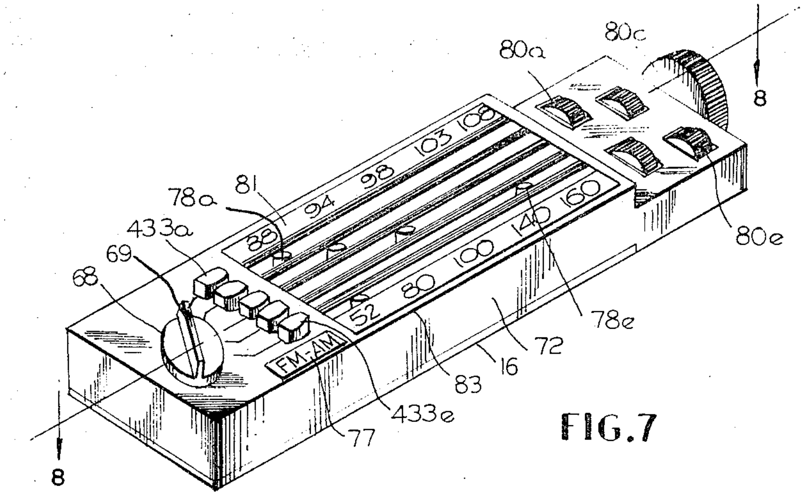

FIG. 7 is a perspective view of the frequency presetting device for the radio receiver of FIG. 1.

Figure 8:
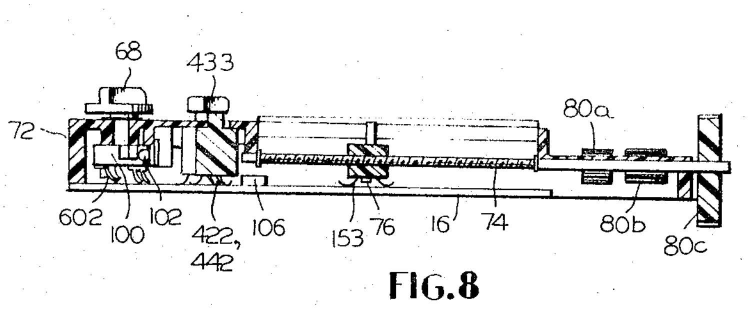

FIG. 8 is a sectional view taken along the line 8—8 of FIG. 7.

Figure 9:
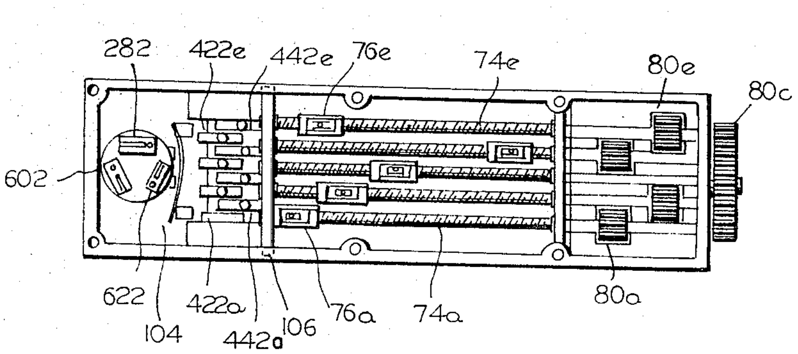

FIG. 9 is a bottom view of the frequency presetting device of FIG. 7 wherein the insulating base 16 is removed.

BRIEF DESCRIPTION OF THE INVENTION

The frequency presetting device according to the present invention is adapted for use with a tuner device including $n (n>1)$ tuning circuits each having plural tuning diodes and comprises $m (m>n)$ potentiometers connected in parallel, one end of which is to be connected to a first power source, and a first rotary switch having $m$ stationary contacts connected to $m$ movable terminals of said $m$ potentiometers and having a rotary terminal connected to said plural diodes. Band selection means consisting of at least one parallel connection of $m$ switches each of which has $n$ contact segments are coupled to said $n$ tuning circuits and to one common terminal. At least one additional rotary switch is also provided having $m$ stationary contacts connected to said $m$ common terminals of said $m$ switches and having a rotary terminal. And a single rotary knob rotates said first rotary switch and said at least one additional rotary switch at a same time whereby said $m$ switches respond to said $m$ potentiometers, respectively. Such a construction can be formed easily in printed circuit form on a single insulating base, and ensures precise dimensions and high durability.

DETAILED DESCRIPTION OF THE INVENTION

Before describing the novel frequency presetting device according to the present invention, an electric circuit preferable for a tuning device comprising said novel frequency presetting equipment will be explained with reference to FIG. 1. Reference characters 10 and 12 designate FM and AM tuning circuits, each having plural tuning diodes (not shown), a high frequency amplifier, a frequency converter, an intermediate frequency amplifier and detector, and each being tuned in a characteristic frequency band. Five potentiometers **15*a*–15*e* in parallel connection are coupled to said FM and AM tuning circuits 10 and 12 through a first rotary switch 24 having five stationary contact 26*a*–26*e* and a rotary terminal 28. Said five potentiometers 15*a*–15*e* have moving terminals connected in sequence to said five stationary contacts 26*a*–26*e*. One side of said five parallel potentiometers is connected to a first power source $-B_1$ and the other side is connected to ground through a variable resistor 23. Each of said five potentiometers adjusts a voltage which is to be imposed on said tuning diodes of said FM and AM tuning circuits 10, 12 so that the receiver tunes to the desired signal frequency. Said variable resistor 23** determines the maximum voltage across said set of five potentiometers.

The FM and AM tuning circuits 10 and 12 are also coupled to band selection means 30 comprising a first parallel connection of five switches **32*a*–32*e* and a second parallel connection of five switches 321*a*–32*e*, said five switches 32*a*–32*e* gang with said five switches 321*a*–321*e* respectively. The first parallel connection of five switches 32*a*–32*e* is connected, at both ends, to the input terminals of the FM and AM tuning circuits 10, 12. Common terminals of the five switches 42*a*–42*e* are connected to a second power source $-B_2$ through a second rotary switch 52 having five stationary contacts 56*a*–56*e* and a rotary terminal 60. The second parallel connection of five switches 321*a*–321*e* is connected, at both ends, to the output terminals of said FM and AM tuning circuits 10 and 12. Common terminals of said five switches 44*a*–44*e* are connected to a following stage 64 through a third rotary switch 54 having five stationary contacts 58*a*–58*e* and a rotary terminal 62. The output signal of said FM tuning circuit 10 or said AM tuning circuit 12 is amplified by the following stage 64 and transmitted to a speaker 66.**

Said first, second and third rotary switches 24 52 54 have their stationary contacts **26*a*–26*e*, 56*a*–56*e* and 58*a*–58*e* assembled on one surface of a single plate and are operated by a single knob 68 which controls the three rotary terminal 28 60 62 so that said three rotary terminals 28 60 62 are switched simultaneously by said single knob 68.**

The operation of the frequency presetting equipment will now be explained with reference to FIG. 1. Among said five potentiometers **15*a*–15*e*, two potentiometers 15*a*–15*b* are adjusted to produce suitable voltages which are to be imposed on the tuning diodes of the FM tuning circuit so that desired frequencies of the FM band are tuned. The other three potentiometers are adjusted to produce voltages which are to be imposed on said tuning diodes of the AM tuning circuit so that desired frequencies of the AM band are tuned, Among the five switches 32*a*–32*e* of the first parallel connection, switches 32*a* 32*b* are switched to the input terminal of said FM tuning circuit 10 and the other switches are switched to the input terminal of said AM tuning circuit 12. In said second parallel connection of five switches 321*a*–321*e*, two switches 321*a* 321*b* are switched to the output terminal of said FM tuning circuit 10 and the other switches 321*c* 321*d* 321*e* are switched to the output terminal of said AM tuning circuit 12.**

Since said first, second and third rotary switches 24 52 54 are operated simultaneously in association with each other, one can easily select his desired frequency of a desired frequency band by rotating said single knob 68 so as to switch rotary terminals 28 60 62 to desired stationary contacts, for example, to stationary contacts **26*a* 56*a* 58*a*.**

In the above description, two tuning circuits, of FM tuning circuit 10 and AM tuning circuit 12, and five potentiometers **15*a*–15*e*** are shown by way of example only, and should not be construed as limitative. However, it is necessary that the number of potentiometers be more than the number of tuning circuits.

The frequency presetting equipment comprising the five potentiometers; the band selection means including the first parallel connection of five switches and the second parallel connection of five switches; and the first, second and third rotary switches is constructed using printed conductors and printed resistors on a single insulating base in accordance with the present invention.

Figure 3:
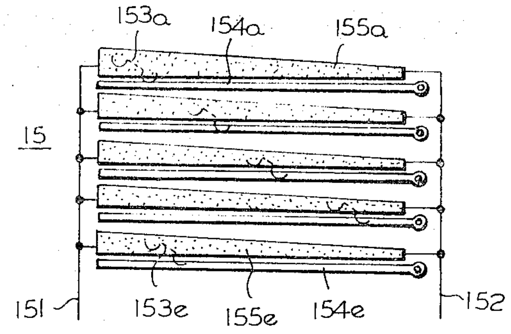
FIG. 3 shows potentiometers, in schematic form, of FIG. 1.

For an easy understanding, an explanation will be first directed to a method of forming the five potentiometers in a printed circuit form. Referring to FIG. 3 wherein similar reference characters designate components similar to those of FIG. 1, five resistance elements **155*a*–155*e* are formed on an insulating base by using suitable and available resistor ink having conductive particles dispersed in a binding vehicle. Said five resistance elements 155*a*–155*e* are connected in parallel to both end terminals 151 152 which are formed by using suitable and available conductor film such as cured conductor ink, electro-plated metal film or etched CCL film. Each of said resistance elements 155*a*–155*e* is accompanied with a conductive track, for example, 154*a* which is prepared in a manner similar to that of said both end terminals 151 152 or resistance element 155. Each of the movable terminals 22*a*–22*e* of FIG. 1 has a conductive track 154*a*–154*e*, shown in FIG. 3, and a moving contact 153*a* 153*e*. The moving contact 153*a* can be slidably mounted on said resistance element 155*a* and said conductive track 154*a*** in any suitable way to form a potentiometer.

Figure 4:
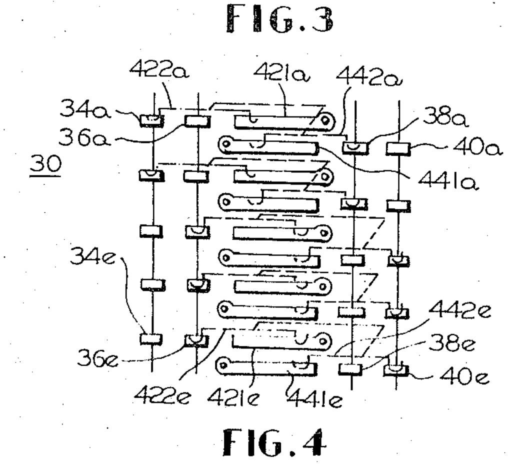
FIG. 4 shows first and second parallel connections of five switches, in schematic form, of FIG. 1.

The formation of the band selection means will now be explained with reference to FIG. 4 wherein similar reference characters designate components similar to those of FIG. 1. Each of said common terminals 42 44 has a common conductive track and a sliding contact. A conductor film is applied to an insulating base to form stationary contacts **34*a*–34*e*, 36*a*–36*e* and common conductive tracks contacts 421*a*–421*e*. Said stationary contacts 34*a*–34*e* are connected to each other and said stationary contacts 36*a*–36*e* are also connected to each other. Similary, stationary contacts 38*a*–38*e*, stationary contacts 40*a*–40*e* and common conductive tracks 44*a*–44*e* are formed. Sliding contacts 422*a* and 442*a* engaged to each other are contacted slidably on said contact segment 34*a* and said common conductive track 421*a* and on said contact segment 38*a* and said common conductive track 441*a* respectively, in any suitable way to achieve a gang switch. In such a way, the aforesaid first parallel connection of five switches 32*a*–32*e* and the aforesaid second parallel connection of five switches 321*a*–321*e*** are constructed.

Figure 5:
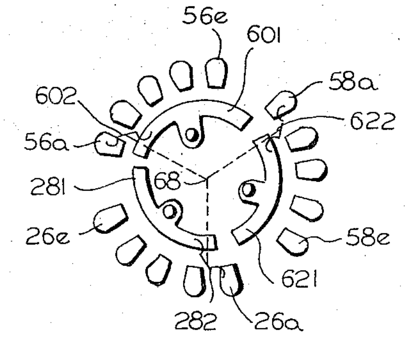
FIG. 5 shows the first, second and third rotary switches in schematic form, of FIG. 1.

The following description will explain an assembly of the first, second and third rotary switches formed on one surface of a single insulating base. Referring to FIG. 5 wherein similar reference characters designate components similar to those of FIG. 1. Each of said rotary terminals 28 60 62 has a rotary conductive track and a rotary contact. Rotary conductive tracks 281 601 621 are positioned to form a circle. Stationary contacts **26*a*–26*e*, 56*a*–56*e* 58*a*–58*e* are located on a circle outside of said common contacts 281 601 621. Three rotary contacts 282 602 622 are secured to a single rotary knob 68 and are in a rotatable contact with said stationary contact 26*a* and said rotary conductive track 281, with said stationary contact 56*a* and said rotary conductive track 601 and with said stationary contact 58a and said rotary conductive track 621**, respectively, in any suitable way to form an assembly of three rotary switches engaged with each other. The stationary contacts and rotary conductive tracks are formed by applying a conductive film to an insulating base.

Said five potentiometers, band selection means and three rotary switches are formed on a single insulating base by any suitable printing circuit technique. They can be connected to each other in accordance with the electrical circuit of FIG. 1. The connection can be achieved by any suitable printing circuit technique.

A preferable printed circuit of the frequency presetting equipment according to the present invention is shown in FIG. 6a and 6b wherein similar reference characters designate component similar to the foregoing figures. Holes in conductor films are used for "through hole" connections between a front face and a back face. Since the electrical circuit of FIG. 6a and 6b is similar to that of FIG. 1, it can be easily understood by those skilled in the art. All movable contacts can be combined with this preferred printed circuit by a well known technique.

Although preferably, the resistor ink has graphite particles dispersed in a binding vehicle, a better result can be obtained when aforesaid resistance elements 155a–155e conductive tracks 154a–154e are formed of said graphite resistor ink. It is also preferable that the rotary conductive tracks, stationary contacts, common conductive tracks and contact segments are coated with plated nickel film. Those processes can be achieved by any well known technique.

More precise and durable frequency presetting equipment can be achieved when the movable contacts of the potentiometers are mounted on a threaded shaft and are moved by rotating said threaded shaft. Such a construction makes it possible to cover potentiometers with a cover and protects the potentiometers from dust in the air. The following description will explain such preferable construction using the printed circuit of FIG. 6a and 6b.

Referring to FIG. 6a–9, said potentiometers comprise threaded shafts 74 rotatably mounted on a housing 72, sliders 76 engaged with the shafts 74, and tuning knobs 80 fixed to the shafts 74. Each of said sliders 76 has a pointer 78 and a moving contact 153. When said tuning knobs 80 are rotated, said sliders 76 are slid along the threaded shafts 74, and said moving contacts 153 are also slid on resistance elements 155 and and on conductive tracks 154 provided on the insulating base 16. Said pointers 78 are also moved with the sliders 76 and indicate adjusted frequencies in reference to FM and AM indicator dials 81 and 83 provided on the housing 72. In the case of a portable radio, one of five knobs 80c is preferably larger than the others and is convenient for changing the tuned frequency. The other tuning knobs are usually preset and are normally covered with a movable lid (not shown).

Each sliding knob 433, slidably mounted on said housing 72, supports sliding contacts 422a–e 442a–e contacting common conductive tracks 421a–e 441a–e and contact segments 34a–e 36a–e 38a–e 40a–e. These common conductive tracks and contact segments are provided on the insulating base a printing circuit technique and are plated by a metal such as nickel to provide a low resistance, high durable electric contact. When a sliding knob 433a is slid, sliding contacts 422a 442a slide from contact segments 34a 38a to contact segments 36a 40a, and AM tuning circuit 12 is connected to said following stage 64 and said second power source $-B_2$. The selections of tuners are indicated by the position of sliding knobs 443a–e in reference to a band indicating plate 77 fixed on said housing 72.

A rotary knob 68 mounted rotatably on the housing 72 has a rotary detent mechanism comprising a cam 100, steel ball 102 and leaf spring 104, and supports three rotary contacts 282 602 622 contacting rotary conductive tracks 281 601 621 and stationary contacts 26a–e 56a–e 58a–e respectively. These rotary conductive tracks and stationary contacts are also provided on the insulating base 16 by a printing circuit technique. When said rotary knob 68 is rotated from the position shown in FIG. 7 to the next detent position, rotary contacts 282 602 622 contact with 26b 56b 58b respectively. Therefore potentiometer 15b is connected to the diodes, and switches 32b 321b are connected to the FM tuning circuit instead of 32a 321a. The rotary detent mechanism confirms contacts between the rotary contact and stationary contacts. An arrow 69 on the rotary knob 68 indicates selected frequency bands and present frequencies through sliding knobs and printers.

A barrier 106 is fixed on the insulating base 16 and prevents the expanding of grease from a portion of insulating base 16 providing fixed points of contact to resistance element 18, so that resistance elements 18 don't swell with grease and aren't broken by movable contacts 153a–e.

Each of the terminals 82 84 86 88 90 92 94 96 and 98 is provided on the insulating base 16 by a printed circuit technique and is connected to said tuning diodes, said second power source, said following stage 64, said input terminal of FM tuning circuit 10, said input terminal of AM tuner circuit 12, said output terminal of FM tuning circuit, said output terminal of AM tuning circuit, said first power source and ground, through the potentiometer 23 as shown in FIG. 1 respectively. As described above, housing 72 of FIG. 7 contains those sections of FIG. 1 enclosed by dotted lines.

Figure 2:
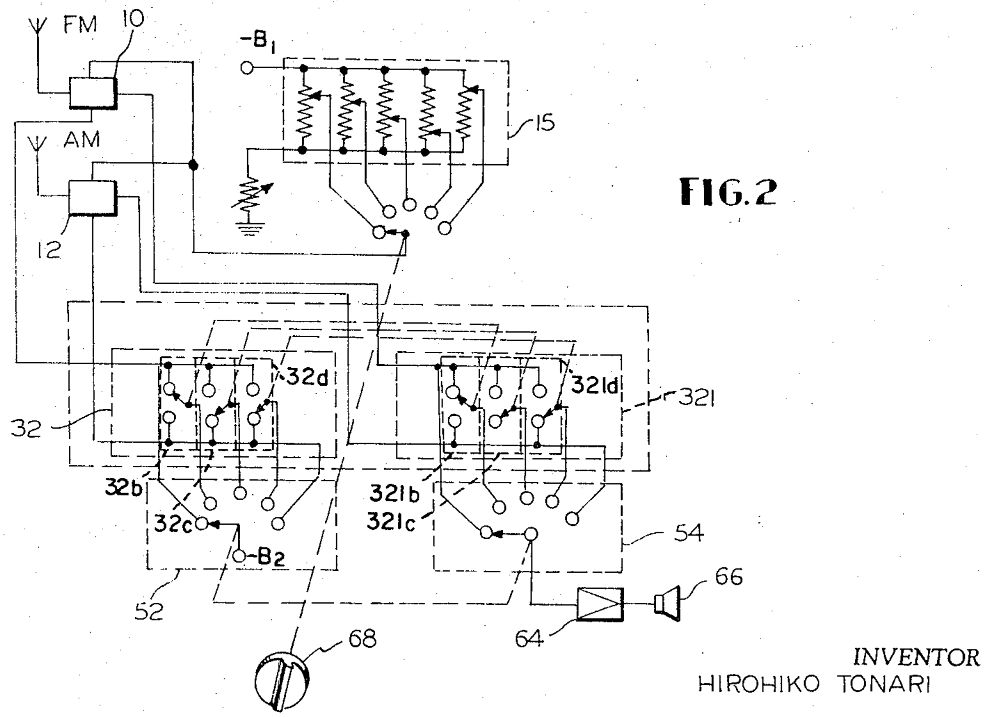
FIG. 2 is also a radio receiver circuit diagram of second preferred embodiment according to the present invention.

FIG. 2 is second preferred embodiment of the present invention. Band selection switchs 32a 321a, shown in FIG. 1 are connected directly to the FM selecting position, and switches 32e 321e are connected directly to the AM selecting position. The remainder of the band selection means 32b 32c 32d 321b 321c 321d are changeable from one band selecting position to the other.

As described hereinbefore, the tuning device employing the novel frequency presetting equipment in a printed circuit is capable of selecting one frequency from plural tuned frequencies of two frequency bands by rotation of a single rotary knob. An operator does not need to move his hand over plural pushing knobs and can obtain the desired frequency immediately by rotation of a single rotary knob. The rotary knob rotates only three rotatable points of contact and the detent mechanism, so that the operating equipment has a high market value because of its light weight and ease of mechanical operation and due to the fact that its band memory device, i.e., the band selection means, is highly stable. All of the preset frequencies and bands are simultaneously indicated by the indicating means consisting of sliding knobs, indicating dials, and points (as best shown in FIG. 7). Therefore, an operator does not need to memorize the relations between the rotating positions of the rotary knob 68 and preset frequencies. Since the receiver is designed to handle only a rotary knob after presetting the potentiometers and selection switches, it leaves a large area for indicating dials. The single receiving equipment employing the novel frequency presetting equipment of the instant invention in a printed circuit form is therefore easy to manufacture which results in a low cost and has a high resistance to mechanical shock.

I claim:

1. Frequency presetting apparatus adapted for a tuner device including $n(n>1)$ tuning circuits, each having plural tuning diodes, which comprises:

$m$ $(m>n)$ potentiometers connected in parallel and having one side adapted to be connected to a first power source;

a first rotary switch having $m$ stationary contacts connected to $m$ movable terminals of said $m$ potentiometers and having a rotary terminal adapted to be connected to said tuning diodes;

band selection means comprising at least one parallel connection of $m$ switches, each switch having $n$ contact segments coupled to said n tuning circuits and one common terminal for selectively contacting one of said $n$ contact segments;

at least one additional rotary switch having m stationary contacts connected to said $m$ common terminals of said $m$ switches and having at least one rotary terminal; and a single rotating means for rotating said first rotary switch and said at least one additional switch at the same time, whereby said $m$ switches correspond to said $m$ potentiometers, respectively.

2. A frequency presetting apparatus as claimed in claim 1 wherein $l$ $(m>l>1)$ common terminals of said $m$ switches fix $l$ predetermined tuning circuits with $l$ stationary contacts of said additional rotary switch, while each $(m-l)$ common terminal of said $m$ switches selectively contacts one of said $n$ contact segments.

3. Frequency presetting apparatus as claimed in claim 1 wherein $n$ output terminals of said n tuning circuits are connected in parallel to said $n$ contact segments of said $m$ switches and said at least one rotary terminal of said additional rotary switch is adapted to be connected to a following stage.

4. Frequency presetting apparatus as claimed in claim 1 wherein $n$ input terminals of said n tuning circuits are connected in parallel to said $n$ contact segments of said $m$ switches, and said at least one rotary terminal of said additional rotary switch is adapted to be connected to a second power source.

5. Frequency presetting apparatus as claimed in claim 1 wherein said $m$ potentiometers, said first and said additional rotary switches and at least one parallel connection of $m$ switches are formed in a single unit on an insulating base equipped with conductive and resistance film.

6. Frequency presetting apparatus as claimed in claim 5 wherein each of said rotary terminals has a rotary conductive track and a rotary contact, said rotary conductive track and said stationary contacts being arranged concentric to the rotating axis of said rotating means and being provided on one surface of said insulating base, said rotary contacts being supported by said rotating means and contacting each rotary contact with both said rotary conductive tracks and one of said $m$ stationary contacts.

7. Frequency presetting apparatus as claimed in claim 5 wherein said potentiometers are separated from said first and additional rotary switches and at least one parallel connection of $m$ switches by a barrier to prevent contact grease from expanding to said potentiometers.

* * * * *